United States Patent [19]
Nakamura

[11] Patent Number: 5,744,370
[45] Date of Patent: Apr. 28, 1998

[54] FABRICATING METHOD OF A SILICON THIN FILM AND METHOD FOR MANUFACTURING A SOLAR CELL USING THE FABRICATING METHOD

[75] Inventor: Naoki Nakamura, Mishima, Japan

[73] Assignee: Toyota Jidosha Kabushiki Kaisha, Japan

[21] Appl. No.: 690,591

[22] Filed: Jul. 31, 1996

[30] Foreign Application Priority Data

Aug. 1, 1995 [JP] Japan .................................. 7-216778

[51] Int. Cl.⁶ .................................................. H01L 31/20
[52] U.S. Cl. .......................... 437/4; 437/101; 427/588; 427/593; 427/595; 427/596; 427/527; 136/258; 136/249
[58] Field of Search ........................ 434/4, 101; 427/527, 427/588, 593, 595–596, 74; 136/258 AM, 249 TJ

[56] References Cited

U.S. PATENT DOCUMENTS 5,089,289  2/1992  Ito ............................................ 427/527

FOREIGN PATENT DOCUMENTS

| 2906058 | 8/1980 | Germany | 136/258 AM |
| 57-66623 | 4/1982 | Japan | 136/258 AM |
| 58-32411 | 2/1983 | Japan | 136/258 AM |
| 58-37972 | 3/1983 | Japan | 136/258 AM |
| 58-86721 | 5/1983 | Japan | 136/258 AM |
| 1-320291 | 12/1989 | Japan . | |
| 2-260666 | 10/1990 | Japan | 136/258 AM |
| 3-060026 | 3/1991 | Japan . | |
| 58-119332 | 7/1993 | Japan | 136/258 AM |
| 2083704 | 3/1982 | United Kingdom | 136/258 AM |

*Primary Examiner*—Aaron Weisstuch
*Attorney, Agent, or Firm*—Finnegan, Henderson, Farabow, Garrett & Dunner, L.L.P.

[57] ABSTRACT

A fabricating method of a Si thin film which has no grain boundaries, photo-absorption characteristics similar to those of monocrystalline Si, and a low electrical resistivity, is provided. When electron beams 14 are applied to a deposition material source 12 to deposit the Si thin film on a substrate 10, assist ions are applied from an assist ion source 18 in the direction normal to the surface of the substrate 10.

11 Claims, 20 Drawing Sheets

5,744,370

FABRICATING METHOD OF A SILICON THIN FILM AND METHOD FOR MANUFACTURING A SOLAR CELL USING THE FABRICATING METHOD

BACKGROUND OF THE INVENTION

1. Field of the Invention

This invention relates to a fabricating method of a silicon thin film having improved photo-absorption characteristics, and to a method for manufacturing a thin-film type solar cell using the silicon thin film.

2. Description of the Related Art

Thin films of silicon (Si) have been Used in electrical devices, such as a solar cell, as ah electrically functional film. The thin film of polycrystalline Si has lower electrical resistance than that of amorphous Si. Furthermore, the thin film of polycrystalline Si has good photo-absorption characteristics, leading to its light absorption edge being at a longer wavelength in comparison with amorphous Si. The thin film of monocrystalline Si is more advantageous with respect to the photo-absorption described above than polycrystalline Si. The high electrical resistance and worse photo-absorption characteristics of the amorphous Si thin film are thought to be due to a small degree of structural order and large oxygen and hydrogen contents.

Therefore, the thin film of poly- or monocrystalline Si is more advantageous for use in a solar cell than that of amorphous Si.

The above described thin film of polycrystalline Si is fabricated by the following method:

A thin film of amorphous Si is formed on an electrical insulating or semi-conductor substrate by chemical vapor deposition (CVD) or vacuum deposition. The formed thin film of amorphous Si is thermally annealed to become recrystallized, and then converted into a film of polycrystalline Si.

A fabricating method of a monocrystalline Si thin film is disclosed in Japanese Patent Laid-Open Publication No. Hei 1-320291. In this conventional technology, when a thin film is deposited on a substrate, ion beams of an inert gas, such as Ar, simultaneously irradiate the substrate in two predetermined directions, leading to the formation of the monocrystalline Si thin film.

However, in the polycrystalline Si thin film fabricated by the above method, recombination of carriers occurs at grain boundaries, shortening the life time of carriers. This decreases the photovoltaic efficiency of the Si thin film.

In the above conventional fabricating method of the monocrystalline Si thin film, the direction of applying the ion beam must be accurately controlled. This is fairly difficult. Furthermore, when the monocrystalline Si thin film is formed by epitaxial growth, a monocrystalline Si wafer must be used as the substrate, leading to high cost. In order to reduce the cost, the monocrystalline Si thin film should be formed on a substrate made of a cheaper material, such as glass, using low temperature heteroepitaxial growth. However, such a technique has not been reported.

An amorphous Si thin film can be formed on a cheap glass substrate, which has a great advantage in terms of manufacturing cost. Single solar cells made of the amorphous Si thin film are stacked in a plurality of layers to form a "tandem structure". A solar cell having the tandem structure has been studied, demonstrating sufficiently good photo-absorption characteristics. The light absorption edge of the amorphous Si thin film originally exists at a shorter wavelength. In this solar cell, therefore, the bandgap of the amorphous Si thin film is controlled by incorporating an additive. This enables single solar cells having different bandgaps. The bandgap-controlled single solar cells are stacked to form the tandem structure. This tandem structure solar cell can absorb light in a wider wavelength range.

FIG. 21 shows an example of this tandem-structured solar cell. In this example, layers of amorphous silicon carbide (a-SiC), amorphous silicon (a-Si) and amorphous silicon germanium (a-SiGe) are stacked. FIG. 22 shows the bandgap of the respective amorphous thin films. In the tandem-structured solar cell shown in FIG. 21, light having wavelengths corresponding to the bandgaps shown in FIG. 22, is absorbed and photo-voltaically converted.

A solar cell using the amorphous Si thin film cannot realize such a photo-absorption characteristic for a wavelength greater than 900 nm, as is possible using the monocrystalline Si, even when it has the tandem structure. Also, the tandem structure requires a complex manufacturing process, increasing the cost of the solar cell.

In addition, the adhesion strength between the amorphous Si thin film and a substrate made of a different material, such as glass, is usually small. Consequently, the amorphous Si thin film can easily be detached from the substrate when it is formed at an inappropriate temperature.

SUMMARY OF THE INVENTION

The aforementioned problems in the related art will be solved by the present invention. The purpose of the present invention is to provide a fabricating method of a Si thin film which does not have any grain boundaries observed in a polycrystalline Si thin film and has photo-absorption characteristics as good as a monocrystalline Si thin film, and to provide a method for manufacturing a solar cell using the Si thin film made by the fabricating method.

The above purpose is achieved by the following aspects of the present invention. According to the first aspect of the present invention, when a Si thin film is formed on a substrate by electron beam deposition, assist ions are simultaneously applied. The energy of the assist ions is in the range of 300 to 1500 eV. The ratio of the number of applied assist ions to that of Si atoms deposited on the substrate (I/A ratio) is in the range of 0.2 to 1.1. The "I" and "A" indicate applied ions and deposited atoms, respectively.

The second aspect of the present invention discloses a fabricating method of a Si thin film according to the first aspect, wherein argon (Ar) ions are used as the assist ions.

The third aspect of the present invention discloses a fabricating method of a Si thin film according to the first aspect, wherein a glass or silicon substrate is used.

The fourth aspect of the present invention discloses a fabricating method of a Si thin film according to the first aspect, wherein a surface of the substrate on which the thin film is deposited is inclined at 45 degrees to the straight line connecting the substrate and a deposition material source, and normal to the incident direction of the assist ions.

According to the fifth aspect of the present invention, when a thin-film type Solar cell is manufactured, the Si thin film used therein is made by the fabricating method provided by the first aspect of the present invention.

The sixth aspect of the present invention discloses a method for manufacturing a thin-film type solar cell according to the fifth aspect, wherein the Si thin film is used as an i layer of a p-i-n type solar cell.

The seventh aspect of the present invention discloses a method for manufacturing a thin-film type solar cell according to the fifth aspect, wherein electrodes are disposed so that carriers move in parallel to the substrate.

The eighth aspect of the present invention discloses a method for manufacturing a thin-film type solar cell according to the fifth aspect, wherein phosphorus (P) is diffused in a Si thin film formed by a fabricating method according to the first aspect of the present invention, when an $n^{++}$ layer is formed just under an electrode fabricated upon the Si thin film layer.

The ninth aspect of the present invention discloses a method for manufacturing a thin-film type solar cell according to the fifth aspect, wherein a Si thin film is formed on a p type silicon layer by a fabricating method according to the first aspect of the present invention, and then phosphorus (P) is diffused in the formed Si thin film to make a pn junction.

The tenth aspect of the present invention discloses a method for manufacturing a thin-film type solar cell according to the fifth aspect, wherein the bandgap of the Si thin film is continuously controlled by continuously varying at least one of the energy of the assist ions, or the I/A ratio.

The eleventh aspect of the present invention discloses a method for manufacturing a thin-film type solar cell according to the fifth aspect, wherein the thin-film type solar cell has a tandem structure comprising three Si thin film layers, and the respective bandgaps of the three Si thin film layers are different from each other.

DESCRIPTION OF THE PREFERRED EMBODIMENTS

The preferred embodiment of the present invention will be described hereinafter by reference to the attached drawings.

EMBODIMENT 1

Figure 1:
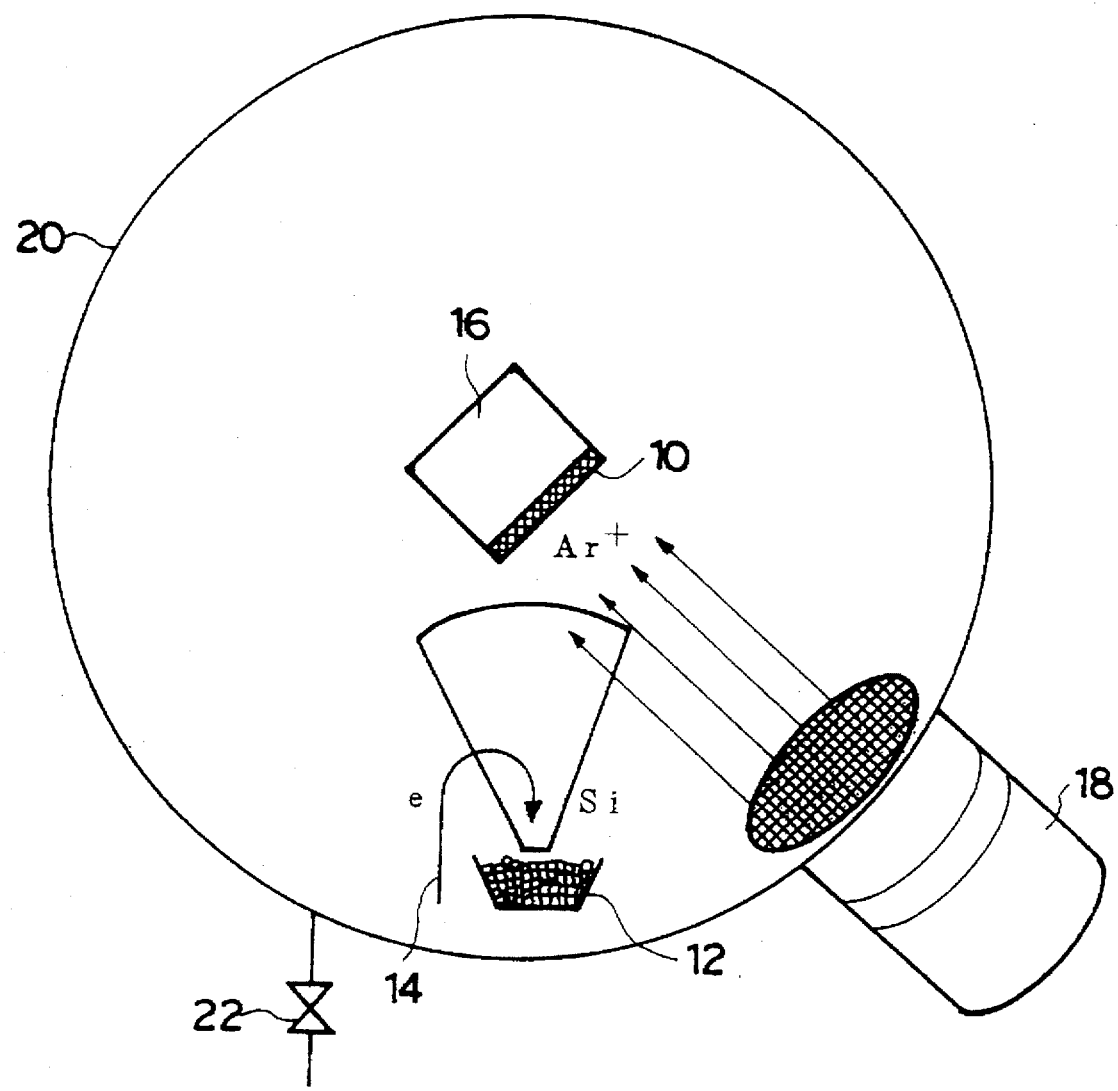
FIG. 1 shows an apparatus for fabricating a Si thin film according to the present invention.

FIG. 1 shows an apparatus for utilizing a fabricating method of a Si thin film provided by the present invention. As shown in FIG. 1, when a Si thin film is formed on a substrate 10, silicon existing on the surface of a deposition material source 12 is irradiated by electron beams and evaporated. The evaporated silicon is deposited on the substrate 10. A substrate made of material, such as glass and Si, can be used as the substrate 10. The substrate 10 is supported in a substrate holder 16, and rotated at a predetermined rotational speed to cause the thickness of the deposited Si thin film to be uniform.

It is a feature of the present invention that assist ions, such as $Ar^+$, irradiate the substrate 10 during the deposition in the direction normal to a surface of the substrate 10. That is, the assist ions irradiate the substrate 10 in only one direction.

The above mentioned assist ions are released from an assist ion source 18 to irradiate the substrate 10. The deposition is carried out in a vacuum chamber 20 connected to a vacuum pump system (not shown) via an exhaust valve 22. The vacuum chamber 20 is maintained at a predetermined pressure by the vacuum prop system. The vacuum pump system has a rotary pump (KRS-1800; Kashiyama Industry Co., Ltd.) as a roughing vacuum pump, and a cryopump (UV208SC14F; Daikin Industries, Ltd.) as a high vacuum pump. The minimum attainable pressure of this vacuum system is $2\times10^{-7}$ Torr.

Example 1 will show a fabricating method of a Si thin film according to the present invention, and Examples 2 to 7 show results of the evaluation of the Si thin film prepared in Example 1.

EXAMPLE 1

A Si thin film was prepared under the following conditions using the apparatus shown in FIG. 1:

Deposited material: Si (purity: 99.999%; Kojundo Chemical Laboratory Co., Ltd.)

Pressure in the vacuum chamber: $4.3\times10^{-7}$ Torr (before deposition) $2.7\times10^{-5}$ Torr (during deposition; the pressure increases due to Ar ions applied to the substrate)

Ion beam current: 168 mA

Deposition rate: 0.6 Å/sec

Flow volume of the Ar gas: 2 ml/min
Acceleration voltage: 800 V
Acceleration current: 25 mA
Deceleration voltage: 800 V
Deceleration current: 0.7 mA
Arc voltage: 80 V
Arc current: 1.5 A
Filament voltage: 5.4 V
Filament current: 160 A
Substrate current: 7.0 mA
Ground current: 0.2 mA
Angle of the substrate surface: 45 degree to the straight line connecting the deposition material source and substrate, normal to the incident direction of the Ar ion
Rotational speed of the substrate: 3 rpm
Cooling of the substrate: indirectly by water When depositing under the above conditions, the ratio of the number of Ar ions (assist ion) to that of Si atoms deposited on the substrate, I/A ratio, was varied from 0.047 to 1.1. Physical properties of the obtained Si thin films were evaluated. The energy of the assist Ar ions was also varied from 100 to 1500 eV. The physical properties of the obtained Si thin films were evaluated. Results of this evaluation are shown in Examples 2 to 7.

EXAMPLE 2

In a fabricating method shown in Example 1, the energy of the Ar ions was fixed at 800 eV, and the I/A ratio was varied from 0.047 to 1.1. The electrical resistivity of several Si thin films prepared by the fabricating method shown above was measured with an electrical resistivity meter (Loresta AP MCP-T400; Mitsubishi Petrochemical Co., Ltd.) by a four probe method of resistivity measurement. Results of the resistivity measurement are shown in FIG. 2.

Figure 2:
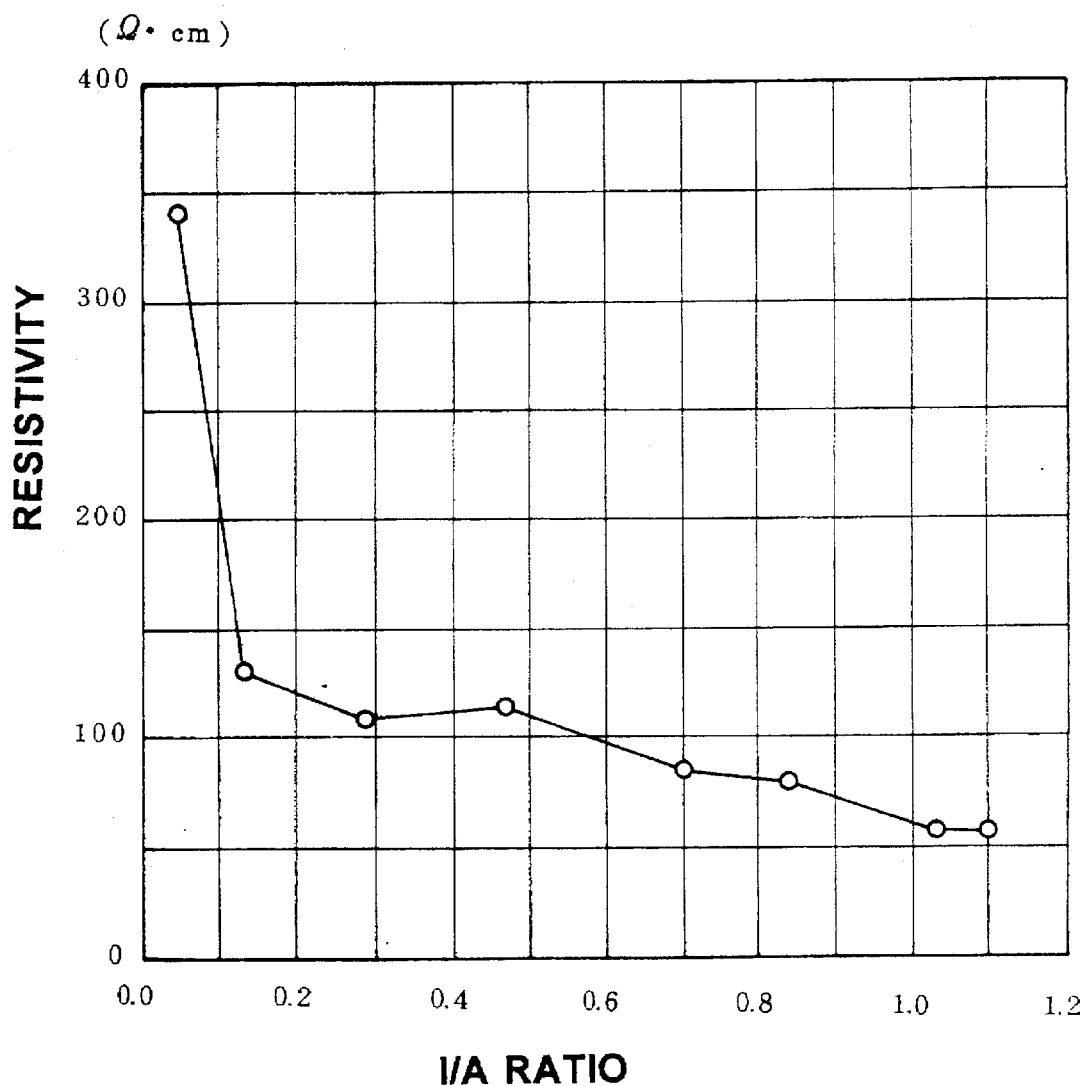
FIG. 2 shows a relationship between the I/A ratio and electrical resistivity of a Si thin film when it is formed according to the present invention.

As shown in FIG. 2, the resistivity of the Si thin film decreased with increase in the I/A ratio. The resistivity of a Si thin film prepared without any application of assist Ar ions was also measured, being beyond the measuring range of the resistivity meter of $1 \times 10^{-2}$ to $1.99 \times 10^7$ $\Omega$.

It was found that the resistivity of the Si thin film was decreased by the application of assist Ar ions. FIG. 2 shows the I/A ratio to be optimum in the range from 0.2 to 1.1.

EXAMPLE 3

Figure 3:
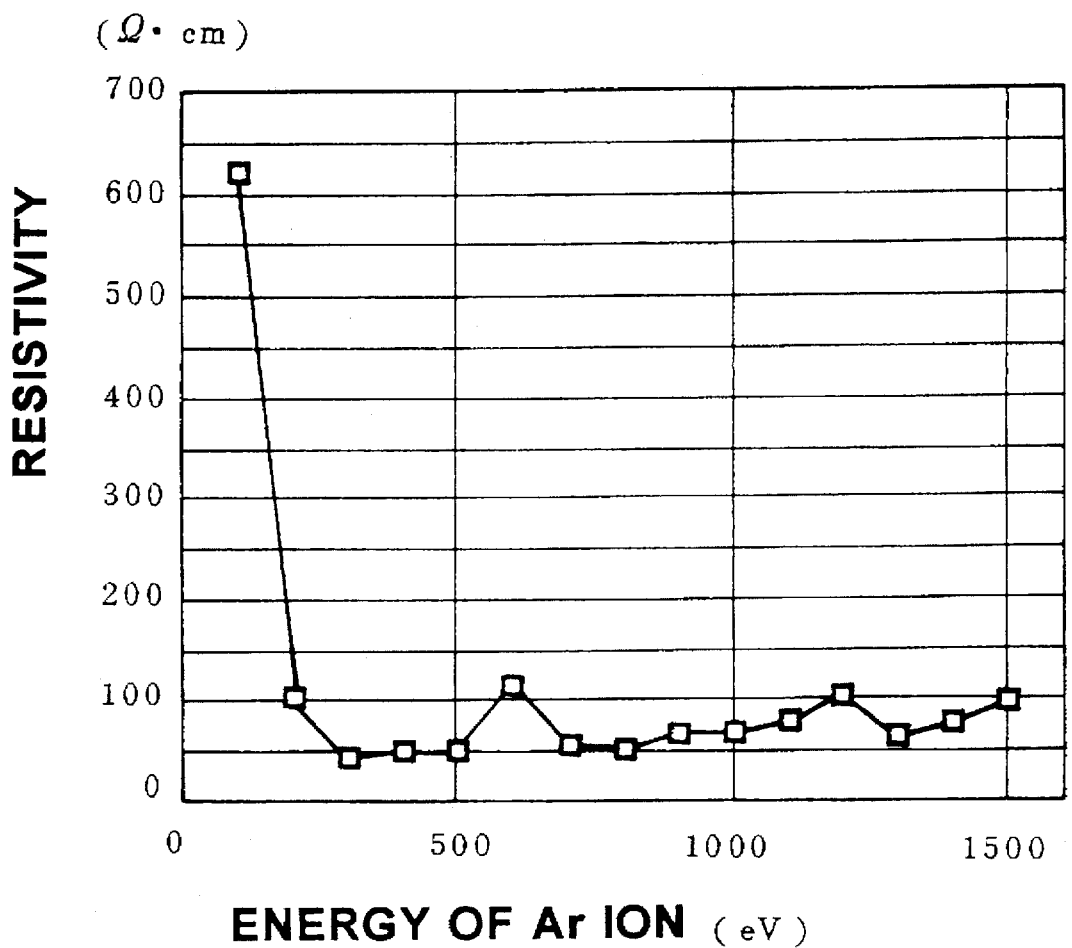
FIG. 3 shows a relationship between the energy of Ar ions and electrical resistivity of a Si thin film when it is formed according to the present invention.

In a fabricating method shown in Example 1, the I/A ratio was fixed at 0.318, and the energy of the Ar ions was varied from 100 to 1500 eV. The resistivity of several Si thin films prepared by the fabricating method shown above was measured by the same method as in Example 2. Results of the resistivity measurement are shown in FIG. 3. Actually, the number of Si atoms deposited on the substrate was $3 \times 10^{16}$/sec, and that of Ar ions applied to the substrate was $9.55 \times 10^{15}$/sec, resulting in an I/A ratio of 0.318.

The measurements of the resistivity were carried out at intervals of the Ar ion energy of 100 eV. As shown in FIG. 3, when the energy is 300 eV or larger, the resistivity remains almost constant at 100 $\Omega$cm or smaller. When a Si thin film is used for a solar cell, a smaller resistivity of the Si thin film is preferable. The Ar ion energy is shown to be optimum in the range from 300 to 1500 eV.

EXAMPLE 4

In a fabricating method shown in Example 1, the energy of the Ar ions was fixed at 800 eV, and the I/A ratio was varied. The absorbance of four Si thin films prepared by the fabricating method shown above was measured with a spectrophotometer (Type 330; Hitachi Ltd.). Results of the spectrophotometry are shown in FIG. 4.

The thickness of the four Si thin films used in this example was 500 nm. The substrate was a 10×10 cm quartz crystal. The pressure in the vacuum chamber was kept at $1.2 \times 10^{-5}$ Torr during deposition.

Figure 4:
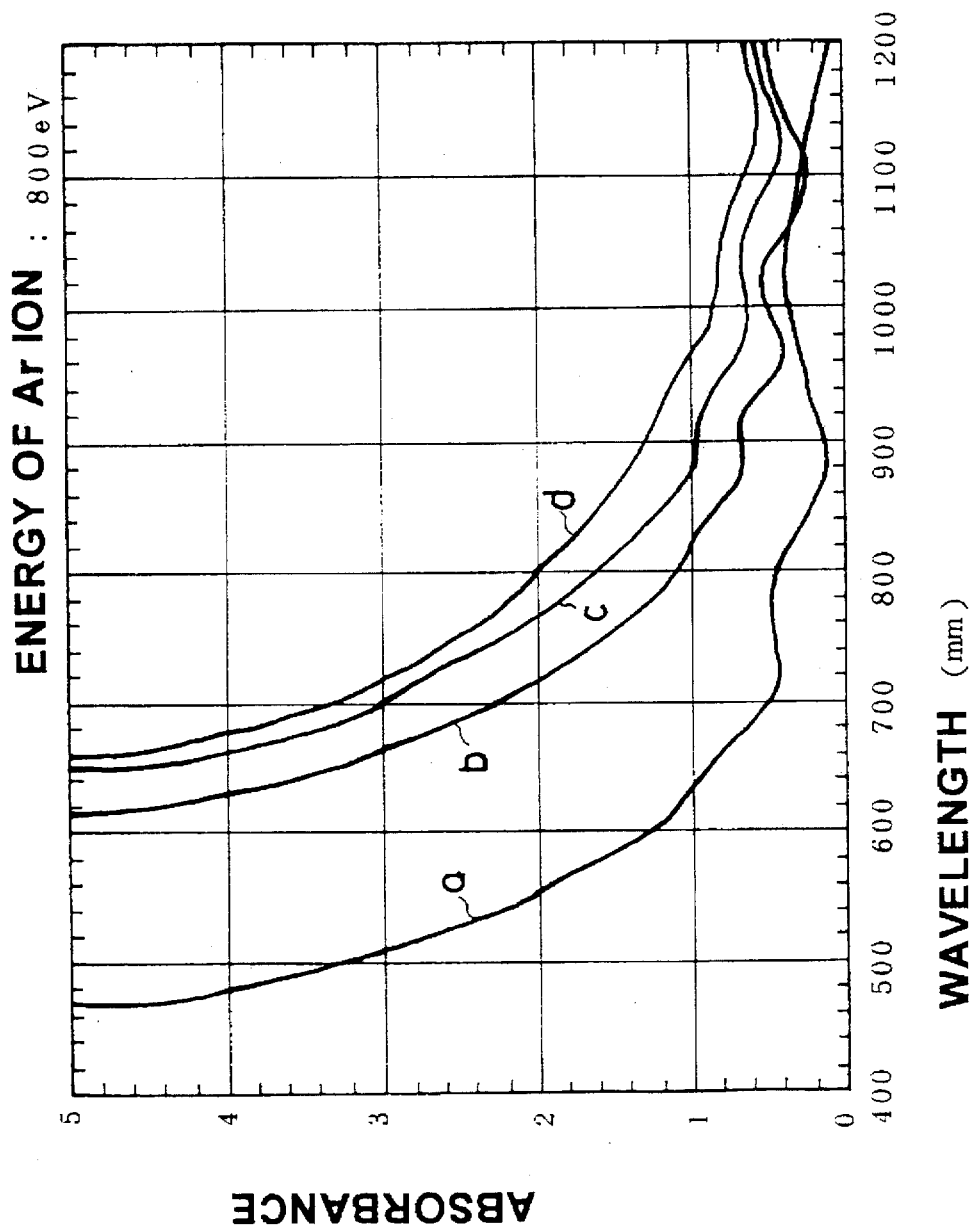
FIG. 4 shows a photo-absorption characteristic of a Si thin film formed according to the present invention.

In FIG. 4, Curve a shows the absorbance of a Si thin film prepared without any application of Ar assist ions, Curve b that of a Si film prepared with the application of Ar assist ions at an I/A ratio of 0.047, Curve c that of a Si film prepared at an I/A ratio of 0.134, and Curve d that of a Si film prepared at an I/A ratio of 0.466. As shown in FIG. 4, the light absorption edges of the Si thin films prepared with the application of Ar assist ions (shown by Curves b, c and d) are shifted toward longer wavelengths, compared with that of a Si thin film prepared without any application of the Ar assist ions (shown by Curve a).

The literature on this technology teaches that the light absorption edge of crystalline Si is 1130 nm, and that of amorphous Si is 700 nm. This indicates that a thin film of amorphous Si is probably formed without any application of assist ions, having a light absorption characteristic shown by Curve a. It is also found that Si thin films prepared with the application of assist ions have a light absorption characteristic near to that of crystalline Si.

Figure 5:
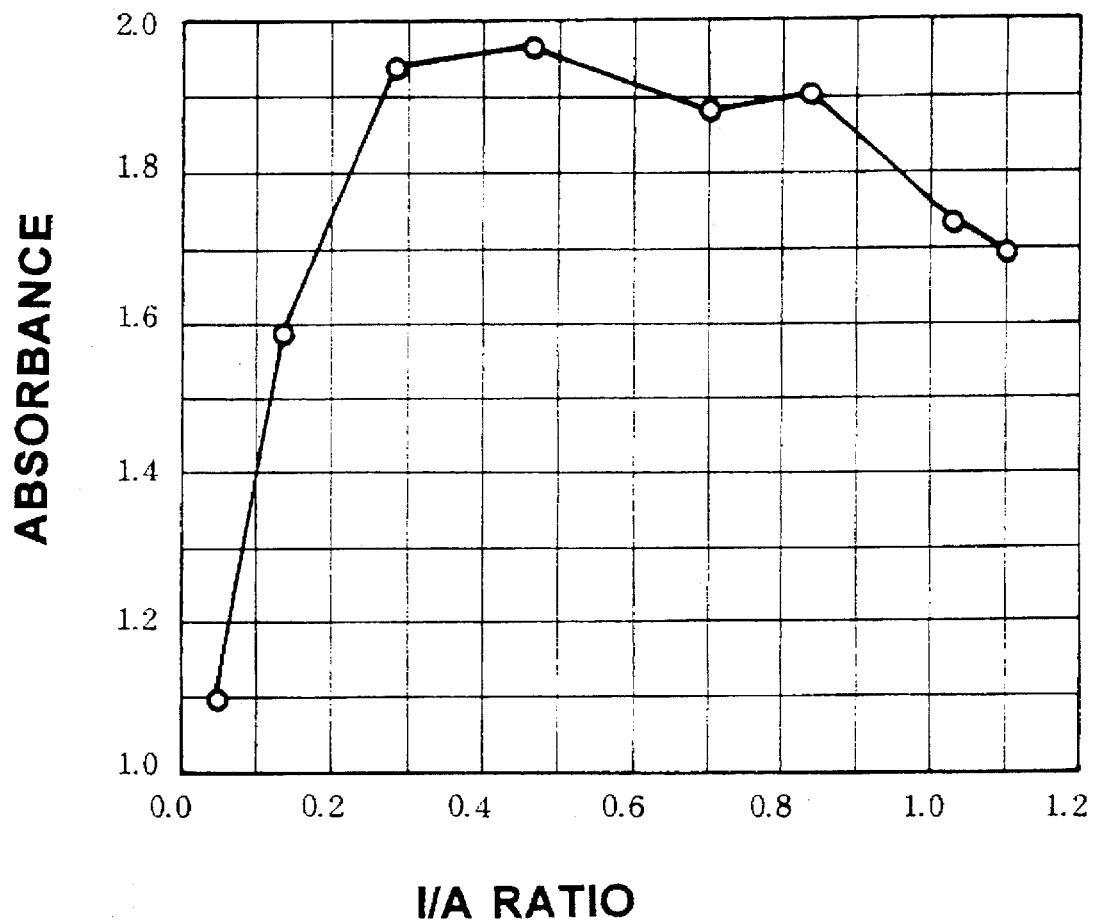
FIG. 5 shows a relationship between the I/A ratio and absorbance of a Si thin film when it is formed according to the present invention.

FIG. 4 shows the absorbances of Si films prepared at an I/A ratio up to 0.466. FIG. 5 shows the absorbances of Si thin films prepared at larger I/A ratios, at a wavelength of 800 nm. As shown in FIG. 5, the absorbances of the Si thin films prepared with the application of assist ions are much larger than that of the Si thin film without any application of assist ions. When the I/A ratio is 0.466, the absorbance is maximum, and then decreases with increase in the I/A ratio.

From the above results, it is found that the optimum range of the I/A ratio is from 0.2 to 1.1.

EXAMPLE 5

In a fabricating method shown in Example 1, the I/A ratio was fixed at 0.318, and the energy of the Ar ions was varied. The absorbance of Si films prepared by the fabricating method shown above was measured. The thickness of the prepared Si thin film, substrate used and pressure in the vacuum chamber were the same as in Example 4.

Figure 6:
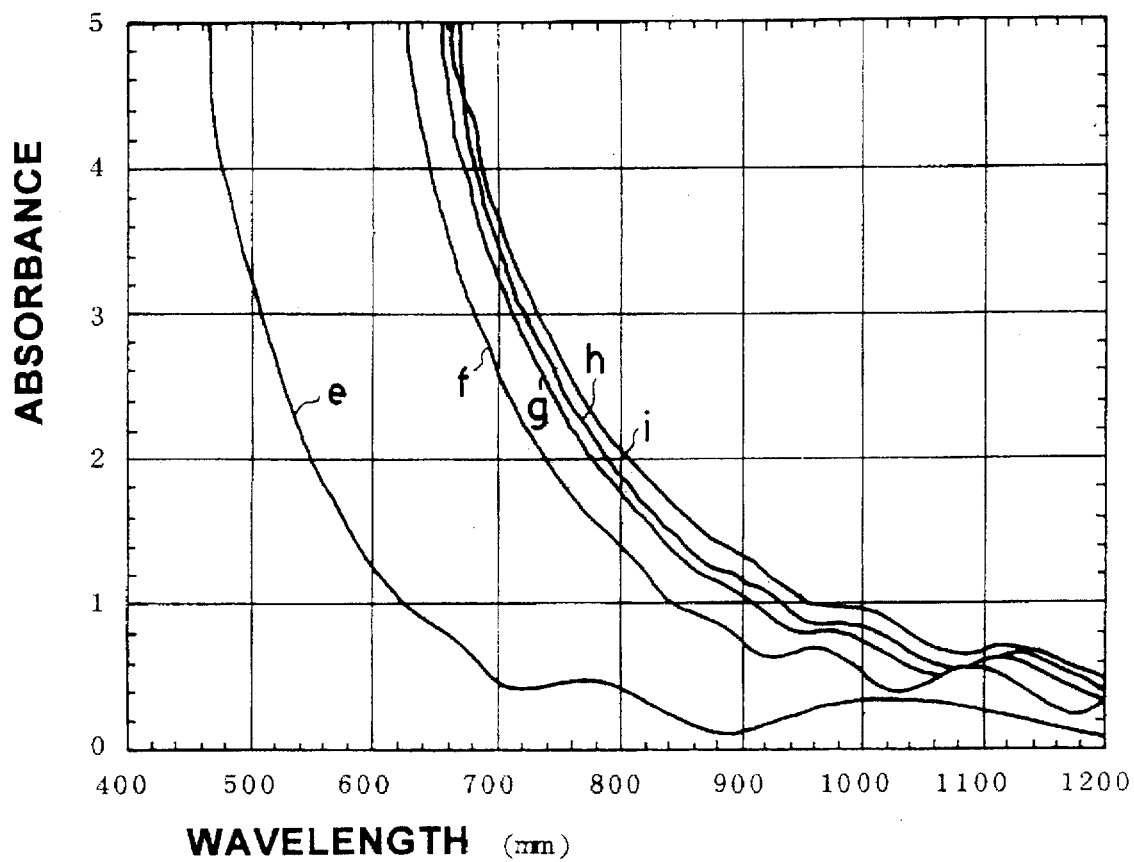
FIG. 6 shows a photo-absorption characteristic of a Si thin film formed according to the present invention.

The I/A ratio was kept at 0.318 during deposition. FIG. 6 shows the measured absorbances. In FIG. 6, Curve e shows the absorbance of a Si thin film prepared without any application of assist ions, Curve f that of a Si thin film prepared with the application of assist Ar ions at an energy of 200 eV, Curve g that of a Si thin film prepared with the application of assist Ar ions at an energy of 300 eV, Curve h that of a Si thin film prepared with the application of assist Ar ions at an energy of 400 eV and Curve i that of a Si thin film prepared with the application of assist Ar ions at an energy of 500 eV.

As shown in FIG. 6, the light absorption edges of the Si thin films prepared with the application of assist ions (shown by Curves f, g, h, and i) are shifted toward longer wavelengths, compared with that of the Si thin film prepared without any application of assist ions. The larger the energy of the assist ions was, the more marked this tendency became.

Figure 7:
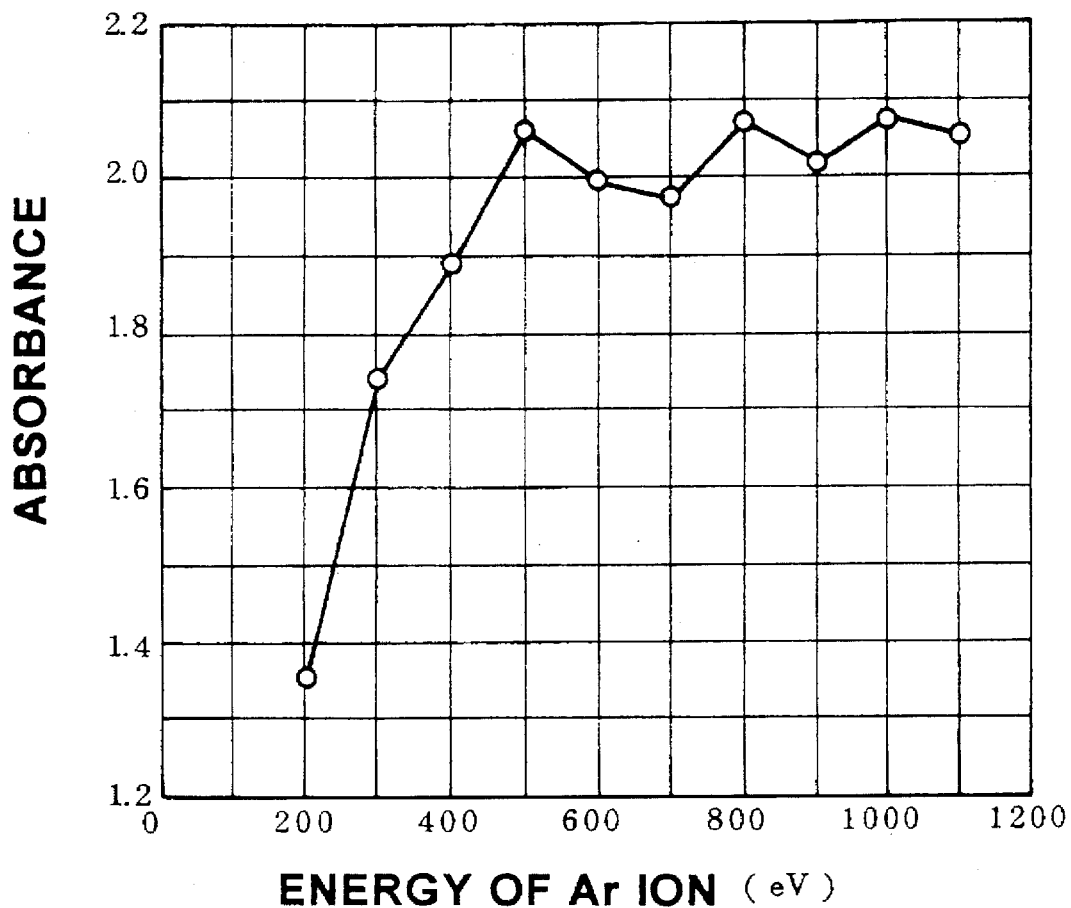
FIG. 7 shows a relationship between the energy of an Ar ion and absorbance of a Si thin film when it is formed according to the present invention.

FIG. 7 shows the absorbances of Si thin films prepared with the application of assist ions at higher energies, at a wavelength of 800 nm. As shown in FIG. 7, the absorbance increases with increase in the energy of the assist ions, and is then saturated at 500 eV or more. From these results, it is found that an energy of the assist ions of 300 eV or higher is preferable. When combining the results of the absorbance and those of the resistivity obtained in Example 3, the optimum energy of the assist ions is in the range of 300 to 1500 eV.

EXAMPLE 6

Si thin films prepared with and without the application of assist Ar ions were analyzed by Auger electron spectroscopy.

The preparation conditions for the Si thin film formed without the application of assist ions were as follows: The pressure in the vacuum chamber was kept at $5 \times 10^{-7}$ Torr during deposition. The substrate ($10 \times 10$ cm quartz) was indirectly cooled by water, and its surface was normally held to the straight line connecting the substrate and a deposition material source. Si was deposited on the substrate at a deposition rate of 0.6 Å/sec to a thickness of 5000 Å.

The preparation conditions for the Si thin film formed with the application of assist ions were as follows: The pressure in the vacuum chamber was kept at $1.1 \times 10^{-5}$ Torr during deposition. The substrate ($10 \times 10$ cm quartz) was indirectly cooled by water, and its surface was held normal to the incident direction of assist ion beams. Si was deposited on the substrate at a deposition rate of 0.6 Å/sec to a thickness of 5000 Å. The energy of the assist ions was 500 eV. The numbers of Si atoms deposited on the substrate and of ions applied to the substrate were $3.26 \times 10^{16}$/sec and $1.01 \times 10^{16}$/sec respectively, resulting in an I/A ratio of 0.31.

The preparation conditions other than the above were the same as in Example 1.

Auger electron spectroscopic analysis was carried out with an Auger electron spectrometer (JAMP-7800; JEOL Ltd.) under the following conditions:
Energy of electrons: 10 keV
Probe current: $7.48 \times 10^{-8}$
Pressure: $2.74 \times 10^{-7}$ Pa
Analyzer mode: M5
CEM HV: 2100 V
Step: 1 eV
Dwell time: 100 ms
Sweeps: 10
Tilt angle: 75 degrees Both Si films were etched by Ar ion sputtering for one minute before analysis to remove an oxide film on the surface.

Figure 8:
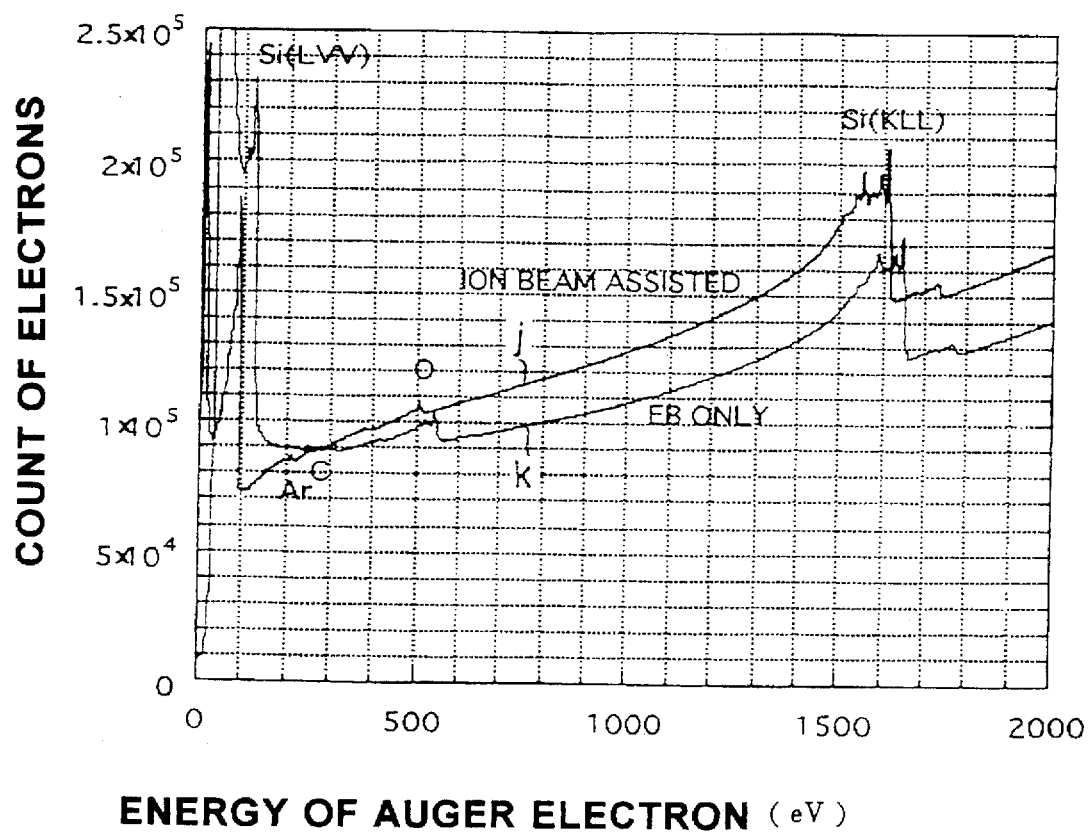
FIG. 8 shows an energy spectrum of a Si thin film formed according to the present invention, obtained by Auger electron spectroscopy.
Figure 9:
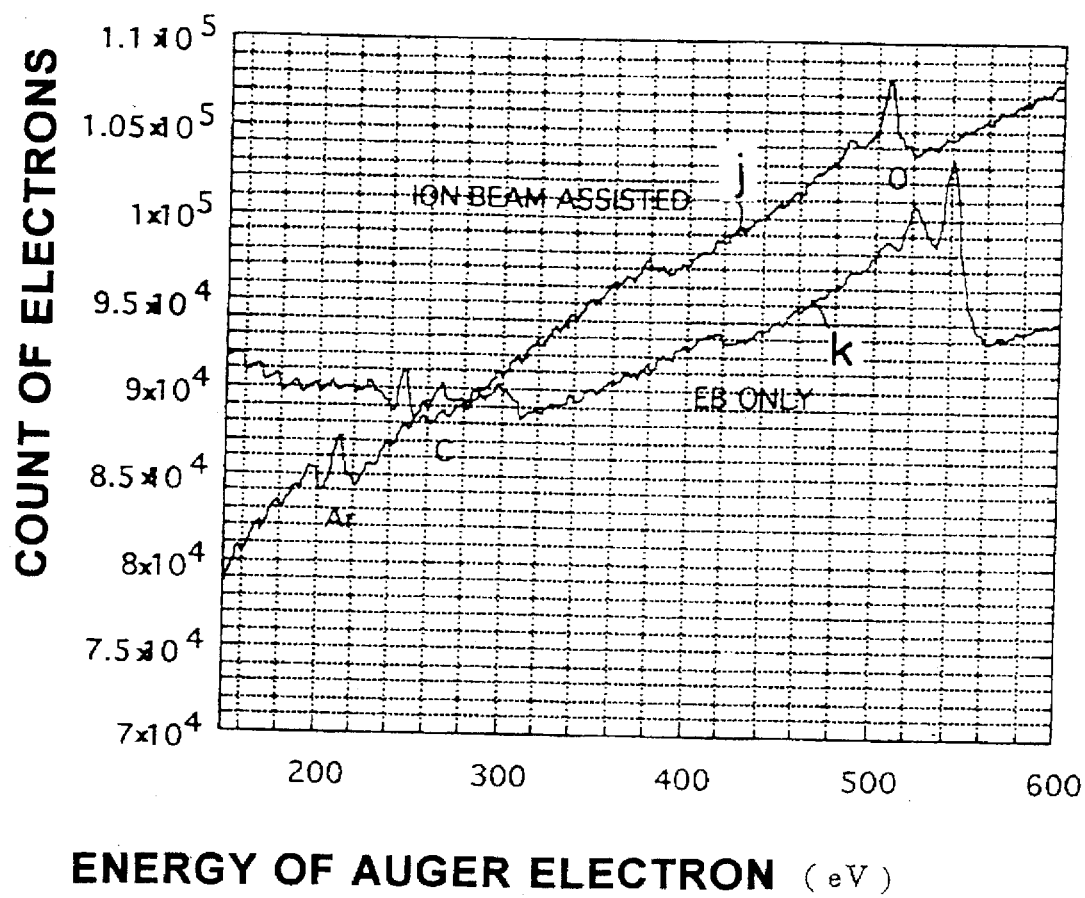
FIG. 9 shows an energy spectrum of a Si thin film formed according to the present invention, obtained by Auger electron spectroscopy.
Figure 10:
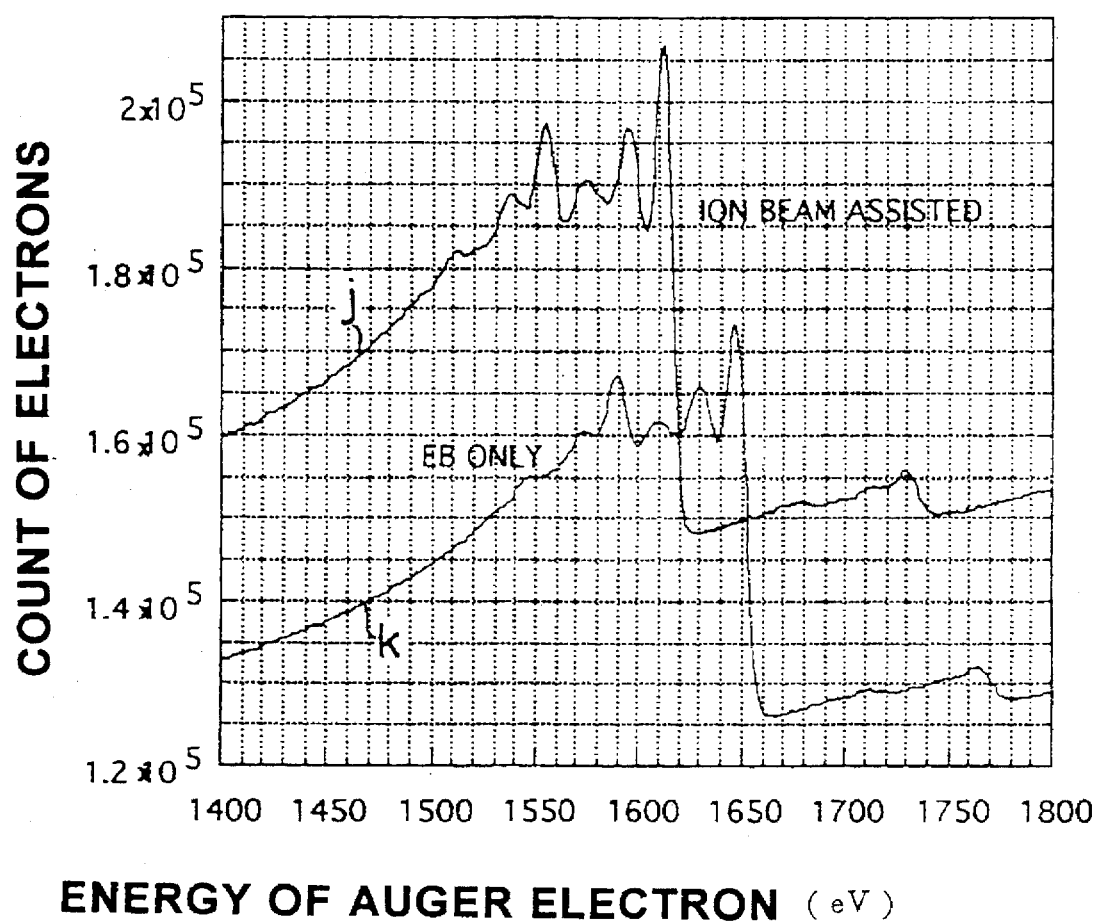
FIG. 10 shows an energy spectrum of a Si thin film formed according to the present invention, obtained by Auger electron spectroscopy.

FIG. 8 shows results of the Auger electron spectroscopic analysis performed under the above conditions. As seen in FIG. 8, the peaks assigned to oxygen (denoted by O) and silicon (denoted by Si) were observed for both of the Si thin films. In order to precisely observe the O and Si peaks, magnified spectra around the O and Si peaks are shown in FIGS. 9 and 10, respectively. In FIGS. 8, 9 and 10, the spectrum of the Si thin film prepared with the application of assist ions is shown by Curve j, and that of the Si thin film prepared without any application of assist ions by Curve k.

As shown in FIG. 9, the detected amount of oxygen for the Si thin film prepared with the application of assist ions is smaller than that for the Si thin film without any application of assist ions. This occurs because the application of assist ions probably reduces the oxygen concentration in the ambient atmosphere, and ejects oxygen atoms contained in the deposited thin film.

As shown in FIG. 10, the Si peak of the Si thin film prepared with the application of assist ions is observed at a 30 eV lower energy, compared with that of the Si thin film prepared without any application of assist ions. In general, this Si peak tends to shift toward a higher energy when the resistivity of the Si thin film becomes higher. Because the forms of both spectra are similar to each other, the oxygen contained in the Si thin film probably exists in the form of $O_2$, not binding to Si atoms. When the oxygen is chemically bound to silicon, the forms of the spectra are different from each Other.

From the results of Example 2 and Example 3, when the I/A ratio and the energy of Ar ions become higher, the amount of Ar in the ambient gas increases, and the relative concentration of oxygen decreases, so that the amount of oxygen contained in the Si thin film decreases. This probably reduces the resistivity of the prepared Si thin film. In addition, when the energy of Ar ions becomes higher, they eject oxygen from the Si thin film more effectively. This probably reduces the resistivity also.

EXAMPLE 7

Scanning electron micrographs of a Si thin film prepared without any application of assist ions and of a Si thin film prepared by a fabricating method shown in Example 1 were taken and the surfaces of both Si thin films were observed.

Figure 11:
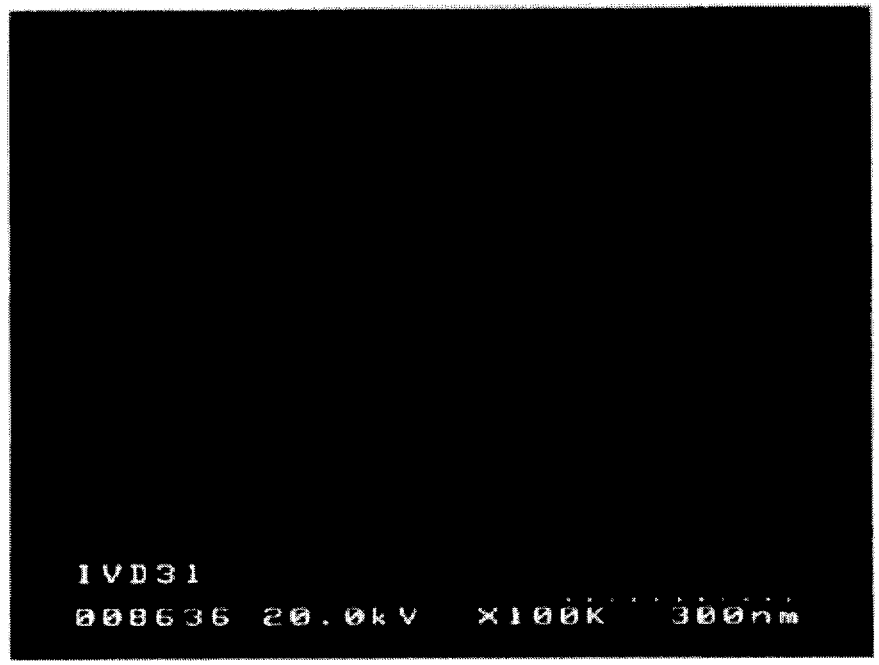
FIG. 11 shows an electron micrograph of the surface of a Si thin film formed without any application of assist ions.

FIG. 11 shows a scanning electron micrograph of the Si thin film prepared without any application of assist ions. Amorphous Si is probably formed in this sample.

Figure 12:
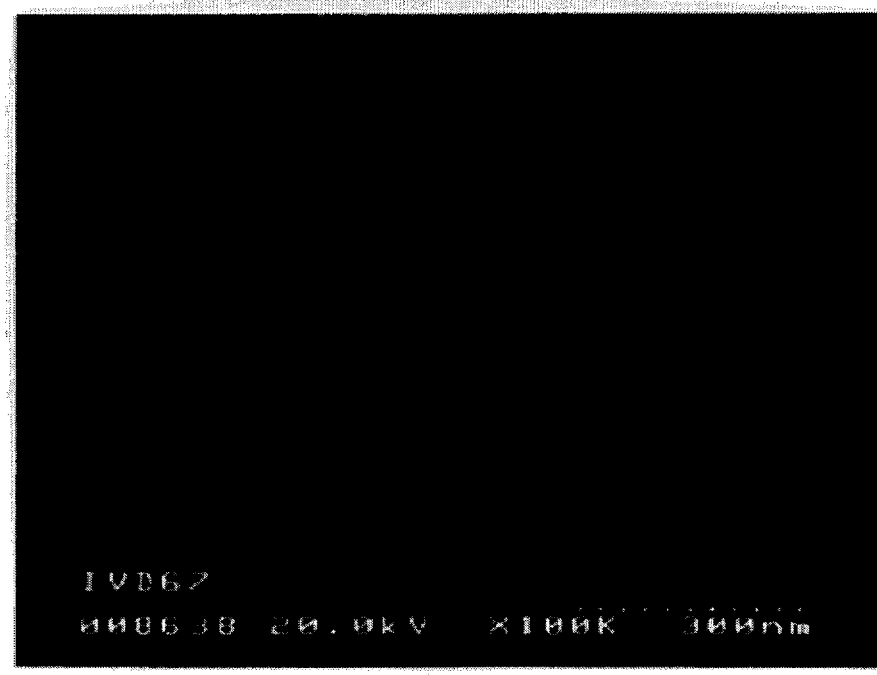
FIG. 12 shows an electron micrograph of the surface of a Si thin film formed according to the present invention.
Figure 13:
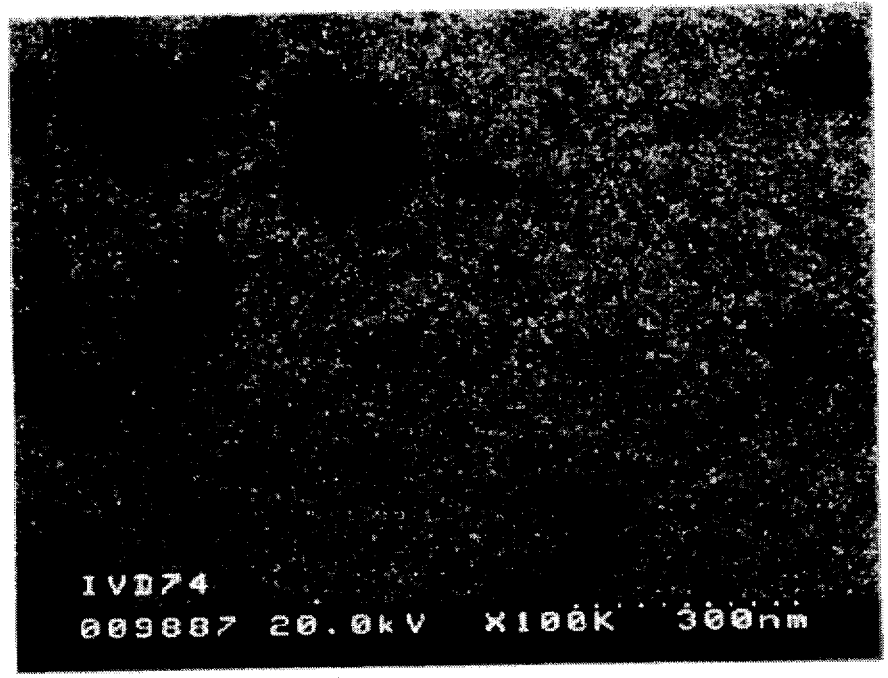
FIG. 13 shows an electron micrograph of the surface of a Si thin film formed according to the present invention.

FIG. 12 shows a scanning electron micrograph of the Si thin film prepared at an Ar ion energy of 800 eV and an I/A ratio of 0.466. FIG. 13 shows a scanning electron micrograph of the Si thin film prepared at an Ar ion energy of 400 eV and an I/A ratio of 0.318.

As seen in FIGS. 11, 12 and 13, all micrographs show almost the same surfaces. This indicates that a Si thin film prepared by a fabricating method provided by the present invention has a structure near to that of amorphous Si.

When combining the results from Examples 2, 3, 4, 5, 6 and 7, a Si thin film prepared by a fabricating method provided by the present invention has the following physical properties: a lower resistivity and a light absorption edge shifted toward a longer wavelength, similar to those of a crystalline Si film. It has a structure near to that of amorphous silicon.

This prevents the recombination of carriers at grain boundaries, and leads to a low electrical resistivity and good photo-absorption characteristics, Consequently, this Si film is suitable for a solar cell. Furthermore, the light absorption edge of the Si thin film is at a longer wavelength. This indicates that a solar cell using the Si thin film does not need the tandem structure as in a conventional solar cell, enabling a single layer type solar cell absorbing light in a wide wavelength range.

The adhesion to a substrate of a Si thin film prepared by a fabricating method provided by the present invention, was strong. This is probably because the amount of contained impurities, such as oxygen, was very small, and the cleaning and mixing effects arising from the application of ions enabled a dense thin film of Si atoms having a strong interatomic bonding force. In addition, the resistivity and light absorption edge of a Si thin film prepared by a fabricating method provided by the present invention, can be controlled by varying the energy of assist ions and I/A ratio. Therefore, the Si thin film produced by a fabricating method provided by the present invention can also be used for another type of solar cell, such as a tandem-structured one.

EMBODIMENT 2

As described before, the light absorption edge of a Si thin film prepared by the fabricating method described in Embodiment 1 is shifted to a longer wavelength, leading to good photo-absorption characteristics. The resistivity of the Si thin film is as low as that of a crystalline Si thin film. The absence of grain boundaries prevents the recombination of carriers, enabling the life time of carriers to be prolonged.

The Si thin film prepared by the method described in Embodiment 1 has the above mentioned properties. When the Si thin film is used as an i layer of a p-i-n type solar cell of amorphous Si, photo-absorption characteristics similar to those of a single layer type solar cell made of crystalline Si can be realized even when formed in a single layer structure. The p-i-n type solar cell can have a high photovoltaic efficiency.

The light absorption edge, corresponding to the bandgap, of the Si thin film prepared by the method described in Embodiment 1 can be continuously controlled by varying at least one of the energy of assist ions and the I/A ratio. Therefore, a solar cell having a wide wavelength range of photo-absorption can be realized without employing the tandem structure.

This can prevent a high cost of the solar cell arising out of a complex manufacturing process, in which the number of stacked layers increases. The degradation of the Si thin film, derived from an increased amount of impurities added for controlling the bandgap, can also be prevented.

In Examples 8, 9, 10, 11 and 12, various solar cells using a Si thin film provided by the present invention, will be shown.

EXAMPLE 8

Figure 14:
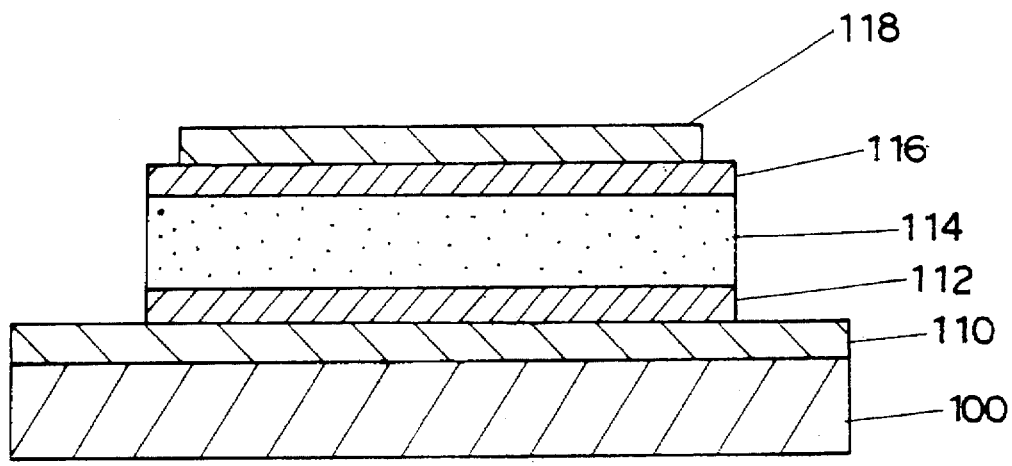
FIG. 14 shows a cross-sectional view of a solar cell using a Si thin film formed according to the present invention.

FIG. 14 shows a cross-sectional view of a solar cell provided in Example 8. In FIG. 14, an electrode 110 is formed on a glass substrate 100. The electrode 110 of $SnO_2$ was deposited at a thickness of 3000 Å by vacuum deposition or sputtering. An electrode made of a transparent conductive material, such as ITO, can be used as the electrode 110.

A p layer 112 is formed on the electrode 110. The p layer 112 of amorphous SiC: H was deposited at a thickness of 100 Å by plasma CVD from silane gas mixed with methane gas.

A Si thin film 114 is formed on the p layer 112 by the fabricating method shown in Embodiment 1. The thickness of the formed Si thin film 114 was 5000 Å.

An n layer 116 is formed on the Si thin film 114. The n layer 116 of μ crystalline Si: H was deposited at a thickness of 200 Å by plasma CVD from silane gas or TEOS.

An aluminum electrode 118 is formed on the n layer 116. The aluminum electrode 118 was deposited at a thickness of 3000 Å by vacuum deposition or sputtering.

The solar cell manufactured by the above described method is a conventional p-i-n type solar cell of amorphous Si, whose i layer is replaced with the Si thin film provided by the present invention. As shown in FIG. 14, the solar cell shown in this Example has a p-i-n single layer structure. The Si thin film provided by the present invention is used for the i layer. This resulted in the photo-absorption characteristics of the solar cell being near to those of a solar cell comprising a monocrystalline Si thin film. In this example, a thermal annealing process is not carried out, in which the i layer is melted and then recrystallized, resulting in polycrystalline Si. Therefore, grain boundaries are not formed. This enables the life time of carriers to be prolonged, because the recombination of carriers at grain boundaries is prevented.

EXAMPLE 9

Figure 15:
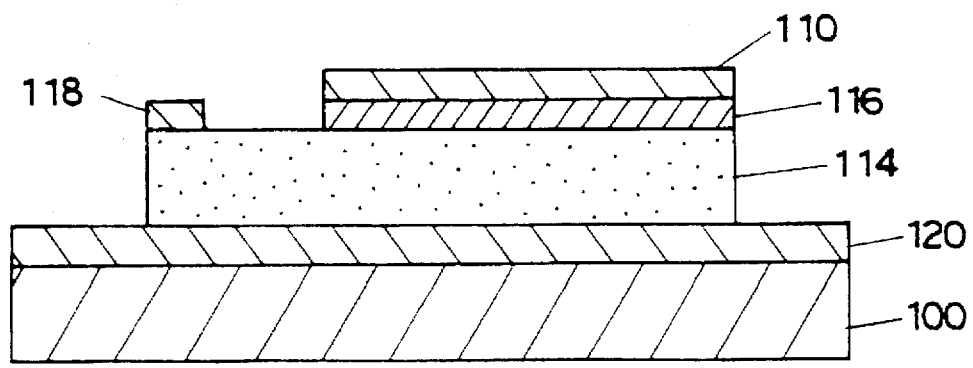
FIG. 15 shows a cross-sectional view of a solar cell using a Si thin film formed according to the present invention.

FIG. 15 shows a cross-sectional view of a solar cell provided in Example 9. In FIG. 15, a buffer layer 120 is formed on the glass substrate 100. The buffer layer 120 of $Si_3N_4/SiO_x$ or the like is used for preventing impurities from entering from the substrate. An alumina ceramic substrate or the like can be substituted for the glass substrate 100.

The Si thin film 114 is formed on the buffer layer 120 by the fabricating method shown in Embodiment 1. The thickness of the formed Si thin film 114 was 5 μm.

The n layer 116 is formed on the Si thin film 114. The n layer 116 of μ crystalline Si: H was deposited at a thickness of 2000 Å by plasma CVD from silane gas or TEOS, as in Example 8.

The aluminum electrode 118 is formed at a place separated from the n layer 116 on the Si thin film 114. The aluminum electrode 118 was deposited at a thickness of 3000 Å by vacuum deposition or sputtering.

Another electrode 110 is formed on the n layer 116. This electrode 110 of $SnO_2$ was deposited at a thickness of 3000 Å by vacuum deposition or sputtering, as in Example 8. An electrode made of a transparent material, such as ITO, can be used instead of $SnO_2$.

In the solar cell shown in Example 9, two electrodes are formed on the top. Therefore, carriers move in parallel to the substrate. In a conventional polycrystalline Si thin film, a number of grain boundaries are located in the horizontal direction, whereas in the Si thin film used in Example 9, no grain boundaries, generated by melting and then recrystallizing, are located. Therefore, even when carriers move in the horizontal direction, the recombination of carriers does not occur. This enables a solar cell having a high photovoltaic efficiency.

EXAMPLE 10

Figure 16:
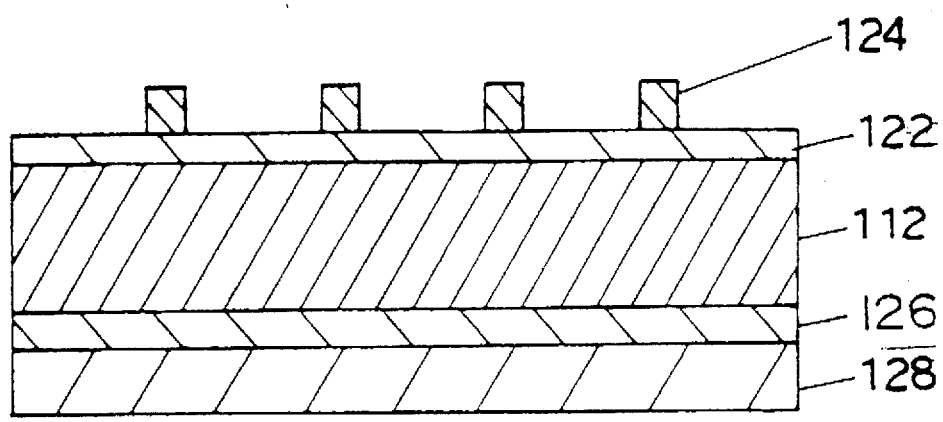
FIG. 16 shows a cross-sectional view of a solar cell using a Si thin film formed according to the present invention.

FIG. 16 shows a cross-sectional view of a solar cell provided in Example 10. In FIG. 16, an $n^{++}$ layer 122 is formed on the p layer 112 deposited on a p type Si wafer. This $n^{++}$ layer 122 was made by diffusing phosphorus (P) at a high concentration into the type Si thin film 112 formed on the p type Si wafer by the fabricating method shown in Embodiment 1. The diffusion of P was carried out by a conventional method using a vapor of $POCl_3$.

A plurality of surface charge collecting electrodes 124 are formed on the $n^{++}$ layer 122. The surface charge collecting electrode 124 is a microelectrode having a structure of Ti/Pd/Ag.

A $p^+$ layer 126 is formed under the p layer 112. An Al/Ag electrode 128 is formed under the $p^+$ layer 126 by vacuum deposition or sputtering. The $p^+$ layer 126 is made by the thermal diffusion of Al present in the Al/Ag electrode 128 into the p layer 112.

An $n^{++}$ layer has usually been formed just under an electrode fabricated above a Si layer to reduce the boundary electrical resistance between the electrode and Si layer. The $n^{++}$ layer 122 in this Example corresponds to the above mentioned $n^{++}$ layer for reducing the boundary resistance. When the $n^{++}$ layer 122 is formed, P is diffused in the Si thin film in this Example, as described above. The Si thin film is formed by the fabricating method shown in Embodiment 1, so that it contains almost no impurities. Therefore, the cancelling by counter impurities does not occur, and the $n^{++}$ layer 122 can efficiently be formed.

Alternatively, in order to reduce the boundary resistance, assist ion irradiated and non-irradiated regions are formed in the Si thin film using a mask, instead of the high concentration P diffusion in the Si thin film layer just under the electrode. When the assist ion irradiated region is formed just under the electrode, the resistivity just under the electrode can be made lower.

Although a p type Si wafer is used in this Example, an n type Si wafer can also be used, wherein a p layer is made by diffusing boron (B).

In a conventional monocrystalline Si solar cell, a pn junction has been formed by diffusing P in a p type Si substrate, or by diffusing B in an n type Si substrate. In this method, however, impurities contained in the substrate cancel the doped impurities. A high concentration of the doped impurities within a smaller depth has not been easily realized.

Figure 17:
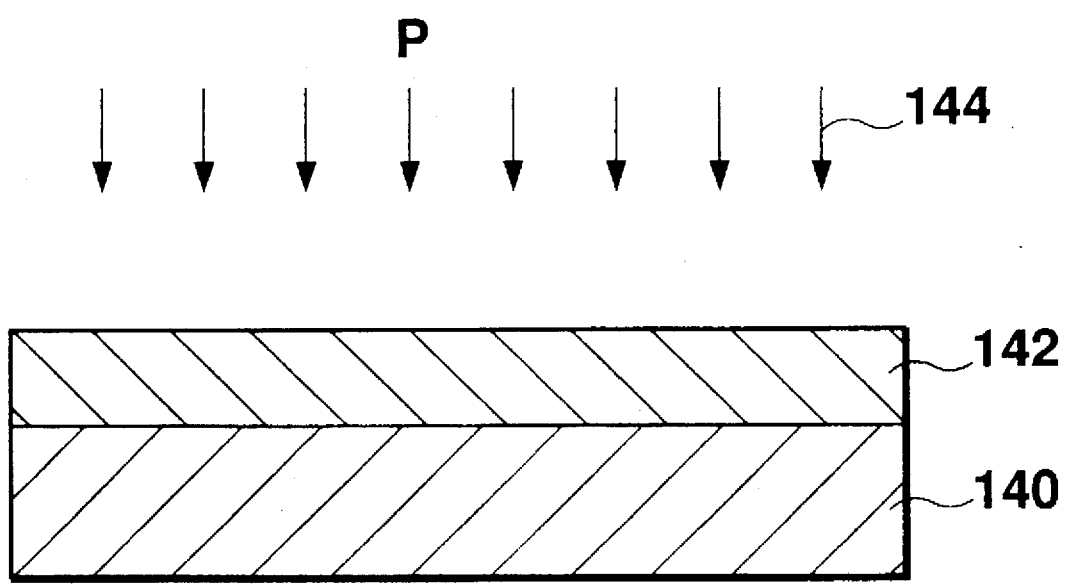
FIG. 17 represents a method for fabricating a pn junction in a Si thin film formed according to the present invention.

The methodology shown in Example 10 is applied to the formation of a pn junction. As shown in FIG. 17, a Si thin film 142 containing no impurities is formed on a p type Si wafer 140 by the fabricating method shown in Embodiment 1. Phosphorus (P) 144 is diffused in the Si thin film to form a pn junction. This prevents the doped impurities from being cancelled by counter impurities, and enables P to be diffused at a high concentration within a smaller depth. Consequently, a solar cell having a high efficiency can be realized. An n type Si wafer can be substituted for the p type Si wafer. Boron (B) is diffused in the n type Si wafer to obtain similar advantages.

EXAMPLE 11

Figure 18:
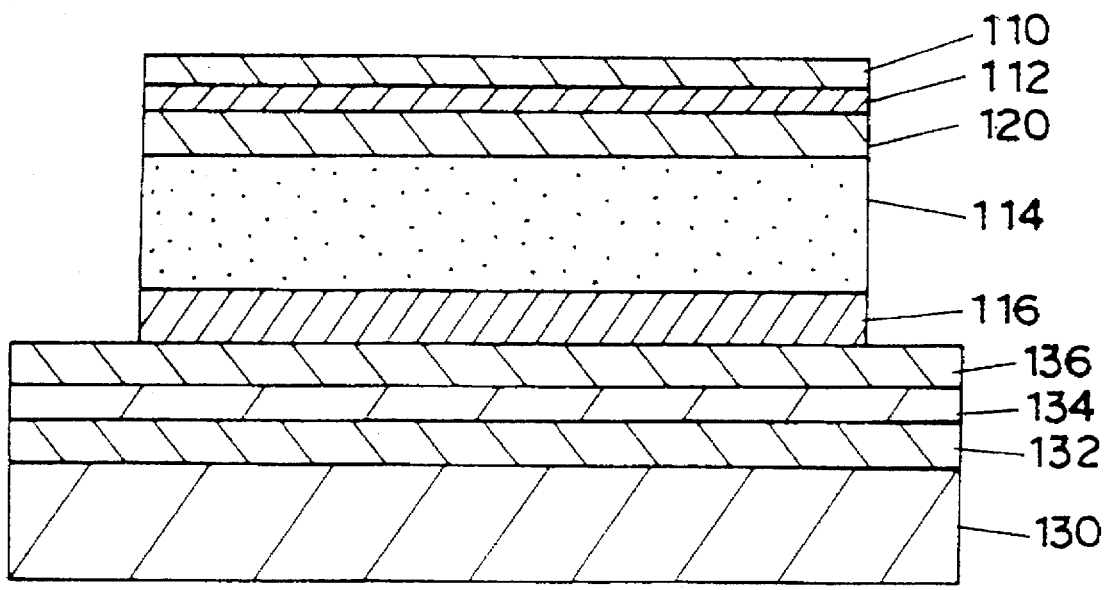
FIG. 18 shows a cross-sectional view of a solar cell using a Si thin film formed according to the present invention.

FIG. 18 shows a cross-sectional view of a solar cell provided in Example 11. In FIG. 18, a Ti layer 132 is formed on a stainless steel substrate 130, an Ag layer 134 is formed on the Ti layer 132, and a ZnO layer 136 is formed on the Ag layer 134. The n layer 116 is formed on the ZnO layer 136. The Si thin film 114, whose bandgap is continuously controlled, is formed on the n layer 116 by the fabricating method shown in Embodiment 1. The buffer layer 120 is formed on the Si thin film 114, the p layer 112 is formed on the buffer layer 120, and the electrode 110 is formed on the p layer 112. The formed electrode 110 is made of transparent ITO.

In this Example, the bandgap of the Si thin film 114 is continuously controlled by the following two methods.

Figure 19:
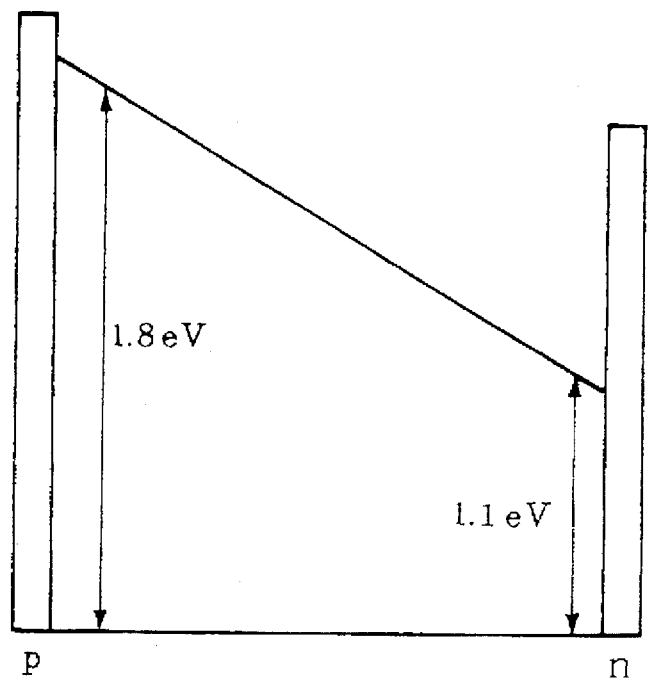
FIG. 19 shows a profile of the bandgap of a Si thin film formed by continuously controlling the bandgap according to the present invention.

In the first method, the energy of the assist ions is kept constant, and the I/A ratio is continuously varied. As shown in Example 4, when the I/A ratio increases, the light absorption edge of the formed Si thin film is shifted toward a longer wavelength. This indicates that the bandgap becomes smaller. In this Example, the bottom of the Si thin film 114, which finally became the boundary between the Si thin film 114 and n layer 116, was firstly fabricated at an I/A ratio of 0.5. The I/A ratio was continuously decreased with the increase in the thickness of deposited Si. The top of the formed Si thin film 114 was finally fabricated without the application of assist ions (at an I/A ratio of zero). This enabled the bandgap to continuously increase gradually from the bottom to the top of the Si thin film 114 (from the n layer 116 to the p layer 112). FIG. 19 shows a change in the bandgap of the formed Si thin film 114. The vertical axis indicates the bandgap, and horizontal axis indicates the depth of the formed Si thin film 114. The left end of the horizontal axis shows the top (facing the p layer 112), and the right end shows the bottom (facing the n layer 116).

The Si thin film 114 was formed at a deposition rate of 3.6 nm/min to a final thickness of 2 µm. The number of assist ions applied to the substrate was continuously decreased at a rate of $5 \times 10^{11}$/sec.

In the second method, the I/A ratio is kept constant, and the energy of the assist ions is continuously varied.

As shown in Example 5, when the energy of the assist ions increases, the light absorption edge, one of the optical characteristics of the Si thin film, is shifted toward a longer wavelength. Therefore, when the Si thin film 114 is fabricated from the bottom to the top with decrease in the energy of assist ions, a Si thin film having such a bandgap profile as shown in FIG. 19, can be obtained, as in the first method.

The bottom of the Si thin film 114, which finally became the boundary between the Si thin film 114 and n layer 116, was first fabricated at an irradiating assist ion energy of 500 eV. The energy of the irradiating assist ions was gradually decreased with increase in the thickness of deposited Si. The top of the formed Si thin film 114 was finally fabricated without the application of assist ions. The Si thin film 114 was formed at a deposition rate of 3.6 nm/min to a final thickness of the 2 µm. The energy of the applied assist ions was continuously decreased at a decreasing rate of 0.015 eV/sec.

As described above, the Si thin film whose bandgap is continuously controlled is formed in this Example. The solar cell using the Si thin film does_not have the tandem structure but a single layer structure, and can absorb light in a wide wavelength range. This prevents the number of layers from increasing, realizing a thin film type solar cell of low cost and high efficiency.

EXAMPLE 12

Figure 20:
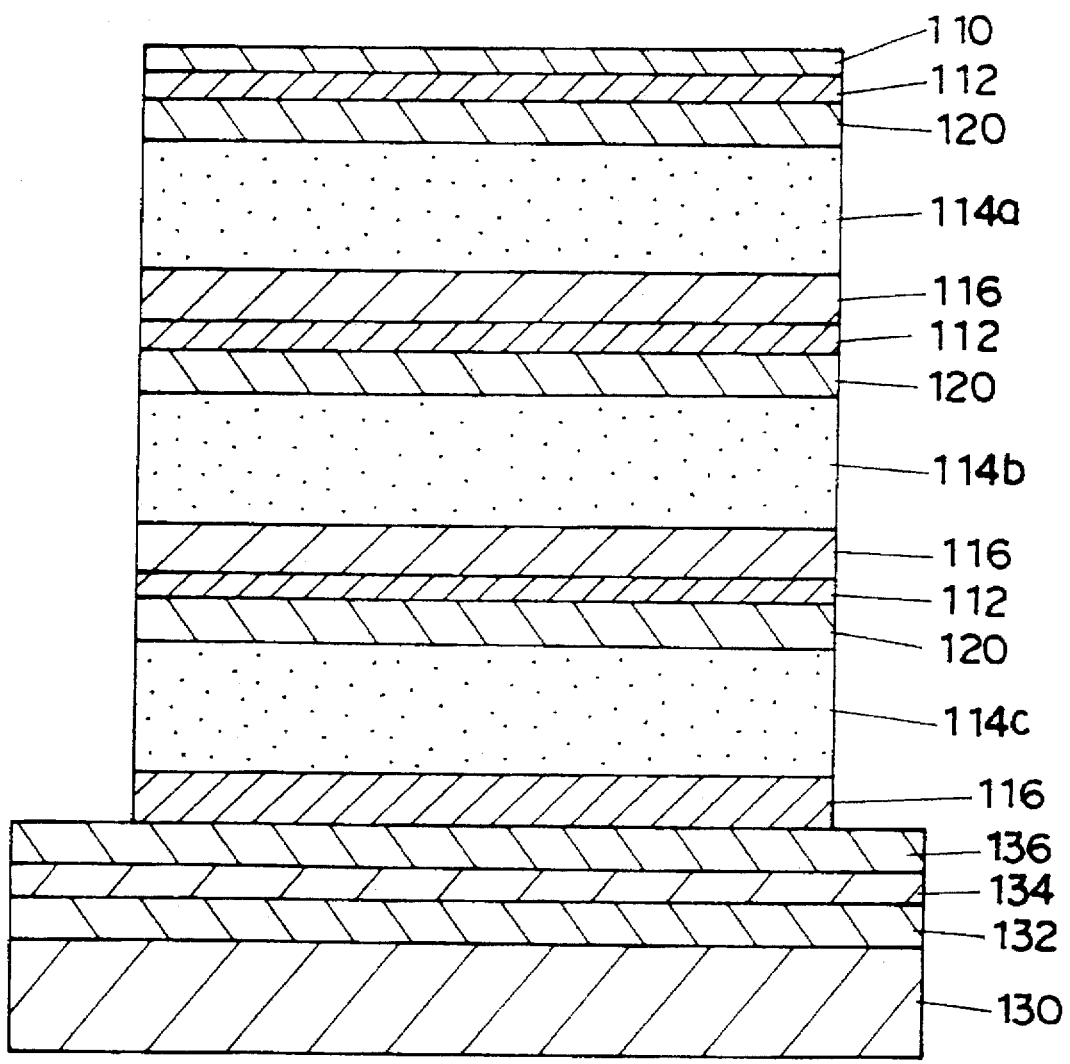
FIG. 20 shows a cross-sectional view of a solar cell using a Si thin film formed according to the present invention.
Figure 21:
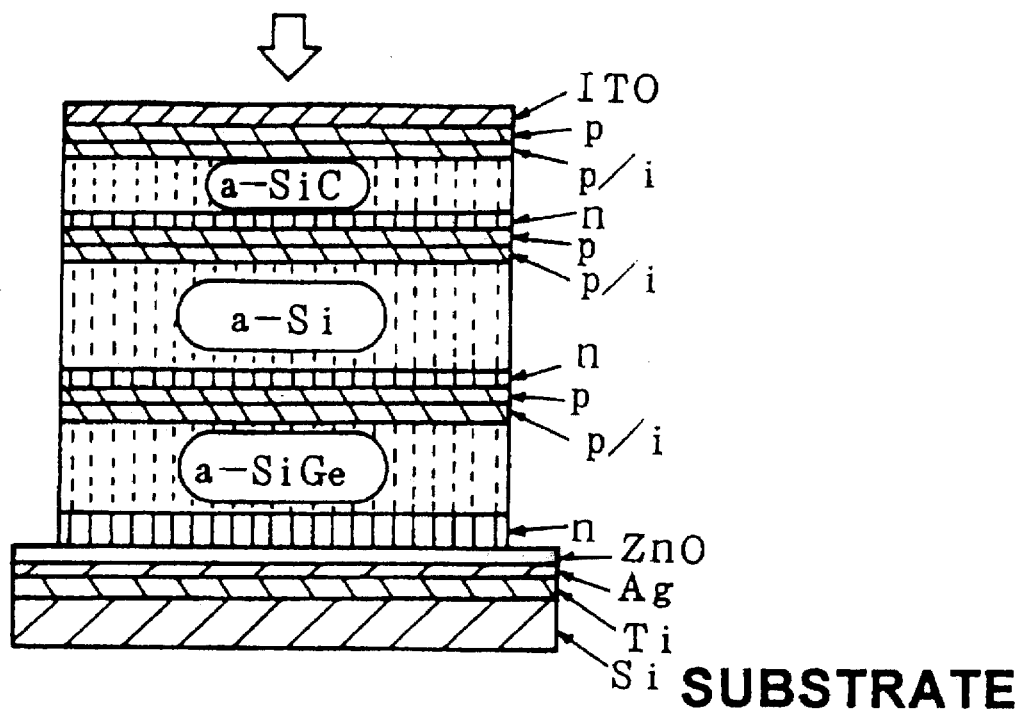
FIG. 21 shows a cross-sectional view of a conventional tandem-structured solar cell.
Figure 22:
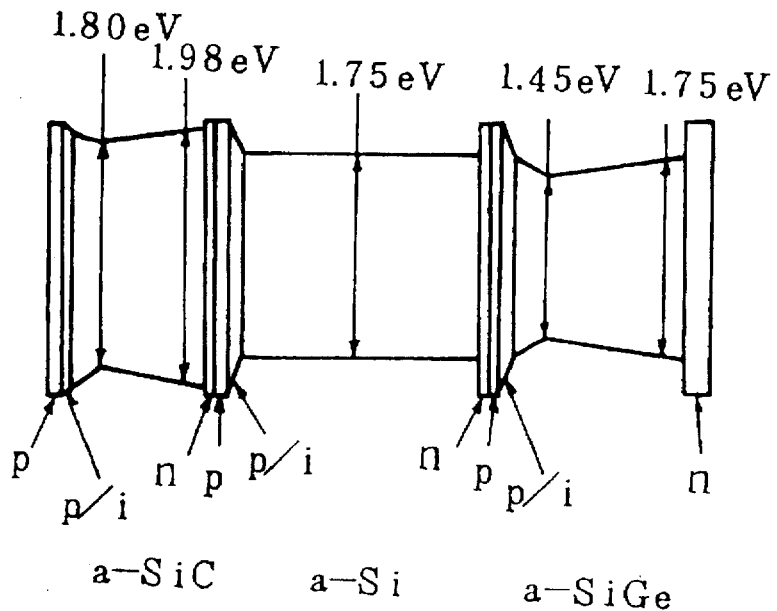
FIG. 22 shows a profile of the bandgap of the tandem-structured solar cell shown in FIG. 21.

FIG. 20 shows a cross-sectional view of a solar cell provided in Example 12. In FIG. 20, the fabrications on the stainless steel substrate 130 to the ZnO layer 136 are the same as in Example 11. A structure composed of the n layer 116, Si thin film 114, buffer layer 120 and p layer 112, shown in Example 11, is repeatedly stacked three times on the ZnO layer 136. The electrode 110 made of transparent ITO is formed on the top.

The bandgaps of the three Si thin films used in this Example are different from each other. The highest Si thin film 114a has the largest bandgap of the three. The middle Si thin film 114b has a medium bandgap. The lowest Si thin film 114c has the smallest bandgap of the three. These bandgaps can be achieved by the fabricating method shown in Embodiment 1, wherein the energy of assist ions or the I/A ratio is controlled.

As described above, the Si thin film provided by the present invention can be used in the tandem structure shown in FIG. 20.

In solar cells shown in Examples 8, 9, 10, 11 and 12, a reflection suppressing film made of $SiO_2$, $TiO_2$, MgO or the like can be formed to prevent reflection at the surface. A pyramidical texture can also be formed by selective etching.

As explained above, the present invention provides a Si thin film having a low resistivity and good photo-absorption characteristics. The Si thin film provided by the present invention is much improved in electrical and optical properties compared with a conventional amorphous Si thin film. The Si thin film provided by the present invention can be formed on a substrate of a material different from Si, such as glass, at normal temperature, and strongly adheres to the substrate.

The Si thin film provided by the present invention has characteristics similar to those of crystalline Si. However, it does not have any grain boundaries, and therefore, when the Si thin film is used in a solar cell, the life time of carriers can be prolonged.

In addition, a Si thin film, whose bandgap is continuously controlled, can be formed by continuously varying at least one of the energy of assist ions or the I/A ratio. A single-layered solar cell which can absorb light in a wide wavelength range, can be realized using such a Si thin film.

While there has been described what are at present considered to be preferred embodiments of the present invention, it will be understood that various modifications may be made thereto, and it is intended that the appended claims cover all such modifications as fall within the true spirit and scope of the present invention.

What is claimed is:

1. A fabricating method of a silicon (Si) thin film which is formed on a substrate by electron beam deposition during which assist ions are simultaneously applied, wherein the energy of the applied assist ions is in the range of 300 to 1500 eV, and an I/A ratio, a ratio of a number of applied assist ions to a number of deposited Si atoms, is in the range of 0.2 to 1.1.

2. A fabricating method of a Si thin film in accordance with claim 1, wherein the assist ions are argon (Ar) ions.

3. A fabricating method of a Si thin film in accordance with claim 1, wherein a glass substrate or a silicon substrate is used as the substrate.

4. A fabricating method of a Si thin film in accordance with claim 1, wherein a surface of the substrate on which a Si thin film is formed, is placed at an angle of 45 degrees to the straight line connecting a deposition material source and the substrate, and normal to the incident direction of the assist ions.

5. A method for manufacturing a solar cell comprising a Si thin film, wherein the Si thin film is fabricated by a fabricating method in accordance with claim 1.

6. A method for manufacturing a solar cell in accordance with claim 5, wherein the Si thin film is used for an i layer of a p-i-n type solar cell.

7. A method for manufacturing a solar cell in accordance with claim 5, wherein electrodes are disposed so that carriers move in parallel to the substrate.

8. A method for manufacturing a solar cell in accordance with claim 5, wherein phosphorus (P) is diffused in the Si thin film fabricated by a fabricating method in accordance with claim 1, when an $n^{++}$ layer is formed just under an electrode formed on a Si layer.

9. A method for manufacturing a solar cell in accordance with claim 5, wherein the Si thin film is fabricated on a p type silicon layer by a fabricating method in accordance with claim 1, and phosphorus (P) is diffused in the fabricated Si thin film in order to form a pn junction.

10. A method for manufacturing a solar cell in accordance with claim 5, wherein the bandgap of the Si thin film is continuously controlled by continuously varying at least one of the energy of the assist ions or the I/A ratio.

11. A method for manufacturing a solar cell in accordance with claim 5, wherein the solar cell has a tandem structure comprising three layers of the Si thin films, and the bandgaps of the Si thin films included in the three layers are different from each other.

* * * * *